(12) United States Patent
Pelloie (10) Patent No.: US 8,381,162 B2
(45) Date of Patent: Feb. 19, 2013

(54) METHOD OF ADAPTING A LAYOUT OF A STANDARD CELL OF AN INTEGRATED CIRCUIT

(75) Inventor: Jean-Luc Pelloie, Moirans (FR)

(73) Assignee: ARM Limited, Cambridge (GB)

( * ) Notice: Subject to any disclaimer, the term of this patent is extended or adjusted under 35 U.S.C. 154(b) by 162 days.

(21) Appl. No.: 12/923,726

(22) Filed: Oct. 5, 2010

(65) Prior Publication Data

US 2012/0081150 A1    Apr. 5, 2012

(51) Int. Cl.
G06F 17/50    (2006.01)
(52) U.S. Cl. .................... 716/133; 716/132; 716/122
(58) Field of Classification Search ............... 716/115, 716/118, 119, 132; 326/101; 438/206
See application file for complete search history.

(56) References Cited

U.S. PATENT DOCUMENTS

2010/0155783 A1 *   6/2010   Law et al. ................. 257/206

* cited by examiner

Primary Examiner — Vuthe Siek
(74) Attorney, Agent, or Firm — Nixon & Vanderhye P.C.

(57) ABSTRACT

A method of adapting a layout of a standard cell of an integrated circuit is provided. A current collection path in the standard cell is selected which connects components within the standard cell to an output connection, wherein the current collection path is arranged to collect current from the components at a plurality of current collection points arranged along its length. A maximum current location on the current collection path is determined at which a maximum possible current flow in the current collection path will occur if the output connection is connected there, the maximum possible current flow being a sum of current contributions from the current collection points. A maximum width of the current collection path at the maximum current location is determined such that the maximum width satisfies a minimum path width requirement with respect to the maximum possible current flow. Then a local width of the current collection path at a selected distance from the maximum current location is determined, the local width being less than or equal to the maximum width, such that the local width satisfies the minimum path width requirement with respect to a maximum local current that will occur at the selected distance, the maximum local current being a sum of the current contributions from those current collection points which contribute to the local current.

20 Claims, 7 Drawing Sheets

METHOD OF ADAPTING A LAYOUT OF A STANDARD CELL OF AN INTEGRATED CIRCUIT

TECHNICAL FIELD

The technical field relates to standard cells for integrated circuits. In particular, the technology is concerned with designing standard cells in which a current conduction path must comply with a minimum width requirement.

BACKGROUND

As the process geometries for integrated circuits progress to ever smaller scales, design constraints on the components of those integrated circuits become ever more strict. In particular, in contemporary integrated circuit design, more and more physical phenomena related to the materials from which the integrated circuit are constructed must be taken into account.

For example, as the conduction elements of integrated circuits get smaller, the effects of electromigration must be considered. Electromigration is the process by which ions in the conduction elements are transported due to momentum transfer from conducting electrons. The smaller the dimensions of a conduction element, the more sensitive it is to the damaging effects of electromigration, resulting over time in the poor performance or even failure of that conduction element. Hence, in addition to the lower sizing limits on conduction elements imposed by the lithographic techniques used to produce integrated circuits, electromigration effects also impose a lower limit on the dimensions of such conduction elements.

For a given current to be conducted by a conducting element, an electromigration constraint can be defined. This electromigration constraint puts a lower limit on the width of that conducting element in dependence on the amount and type of current that will be carried by the conducting element. Some conducting elements, such as those directly connected to a voltage supply, will only carry current in one direction (sometimes called a 'DC current'). Other conducting elements, such as those connected to the output of a logic cell, will carry current in two directions (sometimes referred to as a 'RMS current') as the output load of the cell is charged and discharged. Electromigration width constraints for conducting elements are typically significantly stricter for DC current carriers than for RMS current carriers, since the former are subjected to an uni-directional current flow, which acts more aggressively to relocate ions in the conduction elements.

However the choice of width of a conducting element is not without upper limits either. Parasitic capacitance effects increase with the increasing width of a conducting element and, more significantly, the width of the conducting elements in an integrated circuit are a factor in determining the overall size of the integrated circuit. Thus, as efforts are made to reduce the scale of integrated circuits ever further, upper limits on the width of conducting elements are also brought ever lower.

Accordingly it would be desirable to provide an improved technique for sizing the conduction elements of an standard cell used to produce an integrated circuit, which seeks to balance the above-described competing constraints.

SUMMARY

Viewed from a first aspect, a method adapts a layout of a standard cell of an integrated circuit comprising the steps of:

identifying a current collection path in said standard cell, said current collection path configured to connect components within said standard cell to an output connection, wherein said current collection path is arranged to collect current from said components at a plurality of current collection points arranged along a length of said current collection path;

determining a maximum current location on said current collection path at which a maximum possible current flow in said current collection path will occur if said output connection is connected to said maximum current location, said maximum possible current flow being a sum of current contributions from said current collection points;

determining a maximum width of said current collection path at said maximum current location such that said maximum width satisfies a minimum path width requirement with respect to said maximum possible current flow; and selectively sizing a local width of said current collection path at a selected distance from said maximum current location, said local width being less than or equal to said maximum width, such that said local width satisfies said minimum path width requirement with respect to a maximum local current that will occur at said selected distance, said maximum local current being a sum of said current contributions from those current collection points which contribute to said local current.

Accordingly, a current collection path in the standard cell is first identified, the current collection path being such that it connects components of the standard cell to an output connection. The current collection path is arranged to collect current along its length from a plurality of current collection points.

It will be appreciated that the location of the output connection will not be known in advance, since standard cells are provided as building blocks with which a system designer can determine the logical configuration of a system-on-chip (SoC), and automated routing tools (or a "router") are employed to determine the connections within and between those standard cells, for example the position at which an output connection will actually be connected.

The fact that it is not known in advance where the output connection will be connected means that when setting out the design of a standard cell, all possible locations must be considered and the standard cell must be set out such that it will function correctly wherever the routing tool ultimately connects the output connection.

Hence, a maximum current location on the current collection path is determined at which a maximum possible current flow in the current collection path will occur if the output connection is connected at that point. For example, it may be determined that, for an elongate current collection path with several current collection points along its length, the "worst case scenario" would be for the router to position the output connection at one end of the path. The cumulative current collected from each of the current collection points would then sum to the maximum at one end of the path.

Having thus determined the maximum current location, a width of the path at that location is determined which satisfies a minimum path width requirement with respect to said maximum possible current flow. Given that this location represents the point at which the maximum current flow might be expected, this width therefore represents the maximum width required for the current collection path.

Thereafter the width of the current collection path is, where possible, reduced at a selected distance from the maximum current location. This "local width" at the selected location is chosen such that it satisfies the minimum path width requirement with respect to a maximum local current that will occur at that selected distance, the maximum local current being a sum of the current contributions from those current collection points which contribute to the local current at that selected location. For example, where the maximum local current at the selected distance is lower than the maximum possible current flow at the maximum current location, it may be possible to reduce the width of the path at that point, whilst still satisfying the minimum path width requirement. The local current can be lower than the maximum possible current flow if say the selected distance represents a point at which fewer current collection points will contribute to the current flowing at the point in the path.

Selecting the width of the current collection path to satisfy the minimum path width requirement at the point (the maximum current location) at which the greatest current flow could result if the output connection was connected there is necessary to ensure that the standard cell will reliably operate however the router later connects it to the remainder of the SoC. However, by selectively reducing the path width of the current collection path at a selected distance from the maximum current location, it is possible to reduce the path width and thus, in the tightly space-constrained environment of a contemporary standard cell, to avoid taking up more area of the standard cell than is necessary and also to reduce the parasitic capacitance effects of the path.

Whilst it would be possible only to attempt to reduce the width of the current collection path at one selected distance from the maximum current location, in one advantageous embodiment the method comprises at least one further step of increasing said selected distance and repeating said selectively sizing step. Thus an iterative approach may be taken, and more than one reduction in the width of the path may be introduced, enhancing the above described benefits (e.g. of area reduction and of parasitic capacitance reduction).

As contemporary scales of standard cells reduce, a number of physical phenomena may impose a minimum path requirement on a current collection path, but in one embodiment said minimum path width requirement is an electromigration dependent width requirement. Electromigration effects are becoming a serious constraint on the sizing of the components of contemporary integrated circuit components, wherein trade-offs must be made between the reliability and durability of an integrated circuit and the sizing of the components it contains.

Electromigration constraints can be determined for components which will only carry current in one direction (a "DC limit"), such as for those components associated with the voltage supplies of the standard cell, and can also be determined for components which will carry current in both directions (an "RMS limit"), such as for those components associated with the output of the standard cell. Hence in one embodiment said electromigration dependent width requirement is for uni-directional current flow, whilst in another embodiment said electromigration dependent width requirement is for bi-directional current flow.

In one embodiment said standard cell is arranged to be provided by selectively depositing materials in layers on a substrate. The ever tightening physical constraints on the dimensions of components laid out in this way means that such integrated circuit components may particularly benefit from the technology described in this application.

It will be appreciated that the components from which the current collection path is arranged to collect current could take a number of forms, but in one embodiment said components comprise a plurality of transistors.

In one embodiment said standard cell comprises a plurality of vias, said plurality of vias connecting two layers of said integrated circuit together. Such vias provide a conducting connection between the two layers of the integrated circuit and as such their positioning may be significant in determining where the current collection points on a current collection path lie.

In one embodiment said current collection path is provided as a conduction layer in said layers. For example, the current collection path adapted according to the techniques described may be a particular layer within the standard cell, provided as a conduction layer.

In one embodiment said conduction layer is a first conduction layer deposited over said substrate. In other words, there may be more than one conduction layer in the layers deposited on the substrate and the techniques described may be applied to a current conduction path in a first one of those multiple conduction layers. Alternatively, in one embodiment said conduction layer is a higher conduction layer deposited over said substrate, at least one intervening conduction layer being arranged between said conduction layer and said substrate. In other words the techniques described may also be applied to a higher conduction layer.

Whilst the techniques described may be applied to any current conduction path which must satisfy a minimum width requirement, in one embodiment said conduction layer is a metal layer.

In one embodiment the method further comprises the steps of: identifying a position in said conduction layer in which said local width of said current collection path has been reduced in said selectively sizing step; and increasing a size of a further component within said standard cell provided in said conduction layer adjacent to said position. As such one advantage that may be derived from the reduction in size of part of the current conduction path is that area in the standard cell may be made available to increase the size of another component of the standard cell.

It will be appreciated that a number of different circuit components may represent the further component which may have its size increased, but in one embodiment said further component comprises an input connection of said standard cell. If the input connection of the standard cell can be increased in size in this way, this advantageously gives the router greater freedom in the selection of where is may place an input connector on this input connection. In another embodiment said further component comprises a voltage supply connection path. For example, the connection path leading from the voltage supply of the standard cell to, say, a transistor finger of the standard cell may be increased in size.

Increasing the size of this further component may enable an additional contact, such as a via, to be added to provide a connection between this further component and another of the layers of the integrated circuit and in one embodiment the method comprises the further step of adding a contact between said further component and another of said layers. Adding an additional contact between the respective layers can help to split up the current flowing between those layers and thus reduce the current flow through the parts of the standard cell around that contact. This may for example further help to reduce the width of a current conduction path to which such an additional contact is connected. Furthermore, the addition of an additional contact can help to improve the yield of the integrated circuits produced using the standard cell, due to the contact redundancy provided by the additional contact.

In one embodiment, if said maximum width of said current collection path is determined to exceed a predetermined width limit, said current collection path is sub-divided into at least two independent current collection paths in said conduction layer and said at least two independent current collection paths are connected together via a higher conduction layer deposited over said substrate. It may be the case that when the maximum width of the current collection path is determined, it is found that this width exceeds another constraint on the standard cell. For example there may be an overall upper limit set as a predetermined width limit on the conduction path. This being the case, the standard cell can then be adapted to cope with this scenario by splitting the current conduction path into at least two independent current collection paths and connecting these together by a further (higher) conduction layer. This enables the required current conduction path to be provided, without exceeding the predetermined width limit in any given layer.

A second aspect provides a standard cell adapted according to the method of the first aspect.

A third aspect provides an integrated circuit comprising at least one standard cell adapted according to the method of the first aspect.

A fourth aspect provides a non-transitory computer-readable medium comprising a representation of said layout of said standard cell adapted according to the method of the first aspect.

BRIEF DESCRIPTION OF THE DRAWINGS

The will be described further, by way of example only, with reference to example embodiments as illustrated in the accompanying drawings, in which.

DESCRIPTION OF NON-LIMITING EXAMPLE EMBODIMENTS

Figure 1:
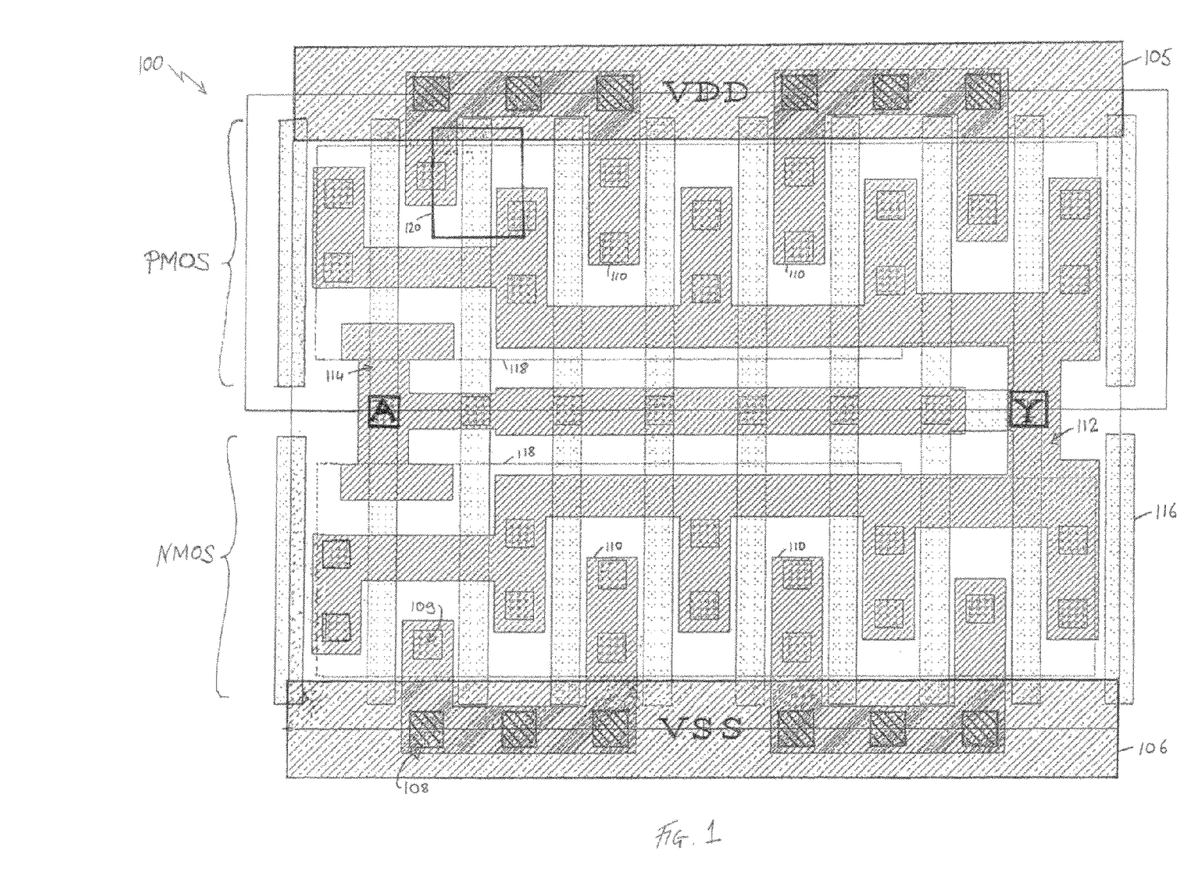
FIG. 1 schematically illustrates a standard cell adapted according to one embodiment.

FIG. 1 schematically illustrates the layout of a standard cell 100 adapted according to one embodiment. This standard cell provides a high-drive inverter which makes use of eight transistor fingers in parallel. The standard cell 100 illustrated is configured to be provided by means of multiple layers being deposited on substrate. For example the inverter may be provided as a Silicon-on-Insulator (SoI) device. In the upper half of the figure eight PMOS transistors have their source connected to the VDD power rail 105 and in the lower half of the figure eight NMOS transistors have their source connected to the VSS power rail 106. The NMOS and PMOS drains are connected together to form the output of the inverter Y. The input of the inverter is labelled A. It should however be noted already at this point that locations at which the output Y and the input A are positioned on their respective wires is not predetermined by the designer of the standard cell, but rather is decided later, when the standard cell is implemented, by the router.

Figure 2:
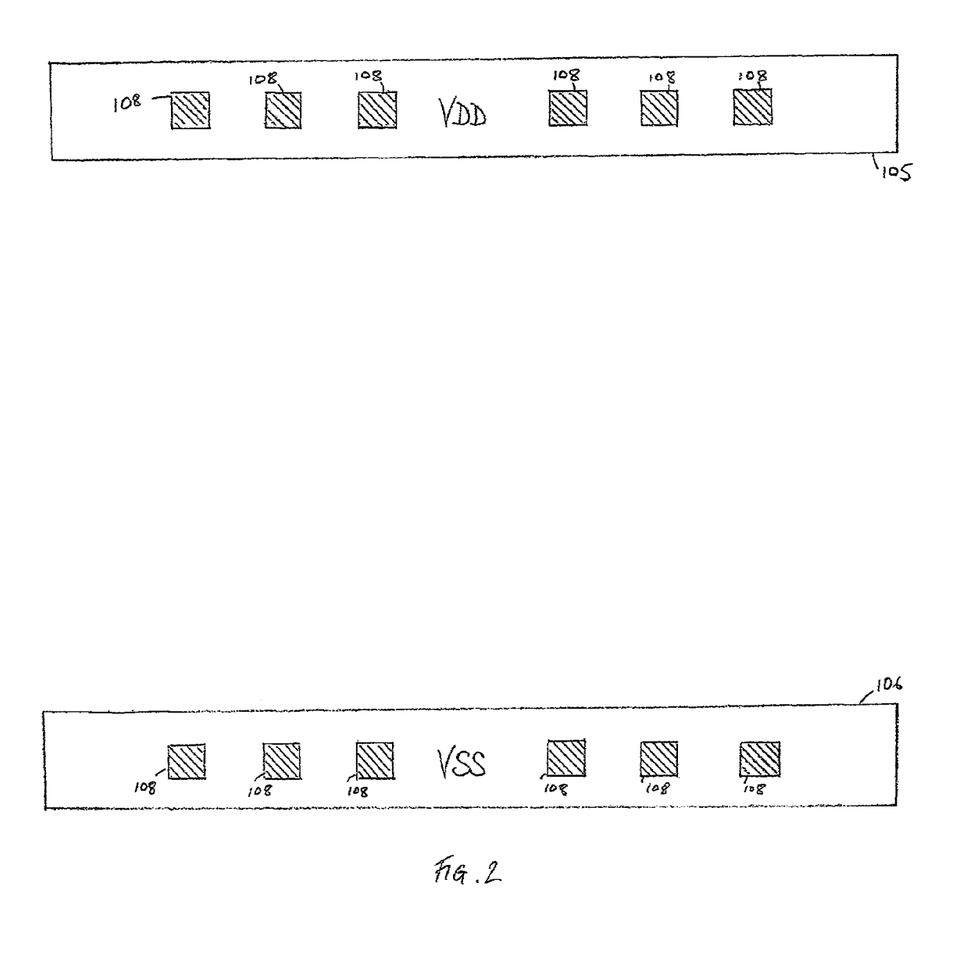
FIG. 2 schematically illustrates the metal 2 layer of the standard cell shown in FIG. 1.
Figure 3:
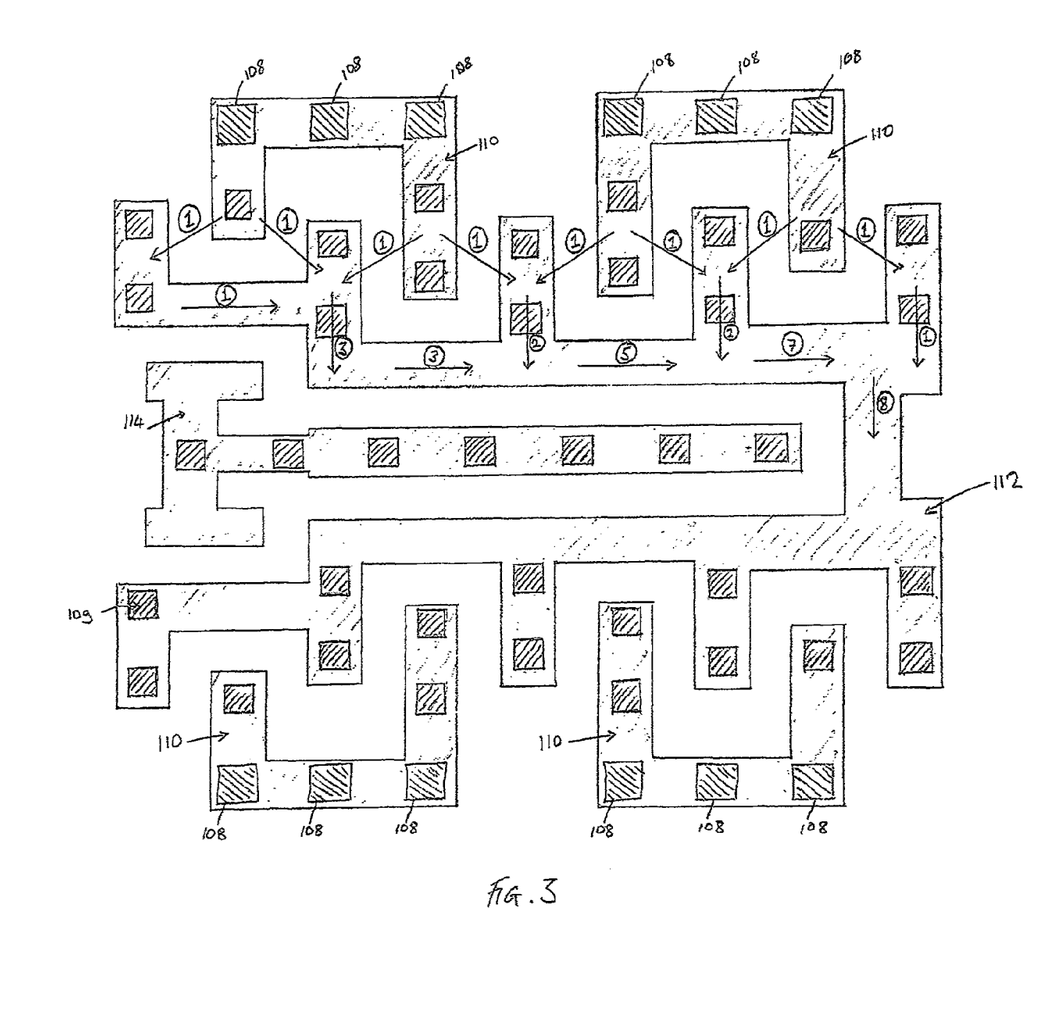
FIG. 3 schematically illustrates the metal 1 layer of the standard cell shown in FIG. 1.

A greater understanding of the standard cell illustrated in FIG. 1 may be achieved by also considering FIGS. 2 and 3. FIG. 2 schematically illustrates the same standard cell as that illustrated in FIG. 1, but wherein all components other than the VDD/VSS power rails and their connecting vias 108 have been removed. On each power rail the six connecting vias 108 which connect the power rail to the metal M1 layer can clearly be seen. FIG. 3 schematically illustrates only the metal M1 layer of the standard cell illustrated in FIG. 1 (as well as its vias 108 connecting to the power rails and its vias 109 connecting to the active area of each transistor).

Returning to FIG. 1, the layout firstly comprises the VDD power rail 105 and VSS power rail 106. The metal M1 layer essentially comprises three parts: the power rail connections 110, the output wire 112 and the input wire 114. The poly 116 can be seen running in vertical strips through the standard cell forming the gates of the transistors in the active region. The active regions are labelled 118. An example transistor is delimited by the box 120.

Considering the metal M1 output wire 112, this component must be configured to handle both DC and RMS current and so the width of this current conduction path must then comply with electromigration requirements to bear the maximum DC and RMS currents that may be delivered by the cell. The minimum width to bear the RMS current is required for the whole of the output path 112 because the output Y connected by the router may be positioned anywhere on this component. Conversely, the minimum width required to bear the DC current will vary depending on the position along this output path. This is because the output current progressively increases along the output path 112 as more transistor fingers contribute to the DC current. This is most clearly illustrated by reference to FIG. 3 where the arrows labelled with numbers in circles represent the current flowing from VDD through the PMOS transistors when the output is rising from 0 to 1.

Viewed from left to right, the first M1 tap (a "tap" referring to the vertical tines of the output path) collects current from only one transistor finger, this current flowing from left to right. The second tap collects the current from two fingers which, added to the current from the first tap, generates a total current corresponding to three fingers (indicated by the 3 in a circle). In this manner the cumulative current increases from left to right as more taps collect the current coming from additional transistor fingers. Finally at the far right hand side the total current is collected from all eight fingers and will connect to this position (see "Y" in FIG. 1) for the output selected by the router.

Consequently it can be seen that the position labelled Y in FIG. 1 represents the "worst case scenario" for the router to position the output connection, in the sense that it will result in the maximum possible current flow in the current collection path represented by the output path 112. Consequently, the width of the output path 112 at "Y" must be selected to handle the cumulative DC current coming from all eight transistor fingers. Progressively moving further away from Y (such that fewer transistor fingers contribute to the cumulative current) the width may be reduced since the minimum width requirement for the correspondingly lower DC current applies. A lower bound on the width of the output path is reached when the DC width requirement becomes as low as the global RMS width requirement. For example in the illustrated standard cell, the RMS minimum M1 width is 51 nm which exceeds the minimum width requirement for the maximum DC current collected from five fingers, whilst the DC minimum M1 width requirement for six fingers is 61 nm.

Hence as can be seen in the Figure, the same width of M1 wire is used for a cumulative current from five fingers and below.

A further feature of the standard cell illustrated in FIG. 1 to be noted is the sizing of the M1 input wire 114. If the same width of the output path 112 had been used throughout the standard cell, the left hand end (as illustrated) of the input wire 114 would be more constrained. This is due to the minimum separation requirements between these two components of the standard cell. However, the reduction in width of the M1 output wire 112 at the left hand side of the figure has enabled the left hand end of the input wire 114 to be extended, resulting in the hammerhead-like configuration illustrated. This has the advantage of providing the router with more flexibility in where the input connector "A" may be positioned (although in the illustrated example the router has positioned the input connection centrally).

Furthermore, the reduction in width of the M1 output wire 112 (progressing from right to left as viewed in FIG. 1) has enabled the central two of the voltage supply connection paths (power rail connections 110) to be increased in length. This increase in length has provided sufficient area for an additional contact (via) to be added connecting to the active area of the transistors. This improves the yield of the final circuit due to the contact redundancy.

Figure 4:
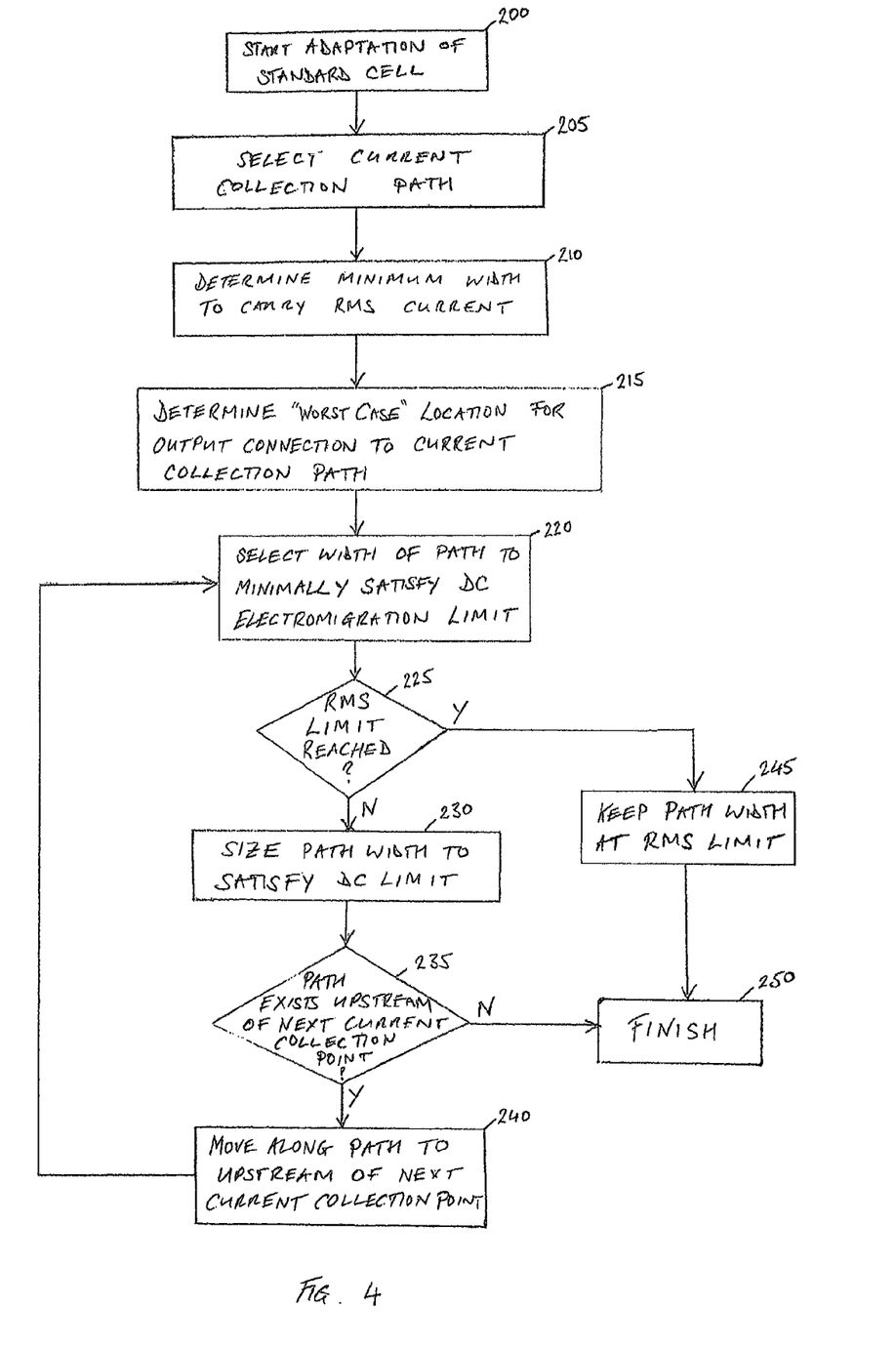
FIG. 4 illustrates a series of steps taken in one embodiment.

An example set of basic steps performed in adapting a standard cell is now discussed with reference to the flow diagram illustrated in FIG. 4. The steps correspond to the adaptation of the metal M1 output wire 112 shown in FIGS. 1 and 3. The flow begins at step 200, whereafter at step 205 a current collection path which connects components within the standard cell to an output of the standard cell is selected.

At step 210 the minimum width requirement to bear the RMS current which this current collection path will experience is determined. Next at step 215 the "worst case" location for the output connection to this selected current collection path is determined. As discussed above, this represents the position which will result in the greatest cumulative current collected from the current collection points along the length of the current collection path.

At step 220 the width of the path (at the location determined at step 215) required to satisfy the DC electromigration limit is selected. Then at step 225 it is checked if the minimum RMS width (determined at step 210) is already reached. If it is not then the flow proceeds to step 230 where the path width is sized to satisfy the DC minimum width requirement. Then at step 235 it is determined if part of the path exists upstream of the next current collection point (if indeed a next current collection point also exists). Given that each current collection point represents the positions along the path where the contributions to the cumulative current are made, a section of path upstream from one of these represents the next location at which it is worthwhile considering if a width reduction is possible. If such a section of path does exist then consideration moves along the path to that point at step 240 and the flow loops to step 220 where the minimum DC width requirement for that section is determined.

If at any stage having determined the minimum DC width requirement at step 220 it is found at step 225 that the RMS width limit has already been reached, then the flow breaks out to step 245, the path width is kept at the RMS limit and the flow finishes at step 250. Also, if at step 235 it is determined that there is no further path upstream of the next current collection point (or indeed that no current collection point upstream exists) then the flow also proceeds to the finish at step 250. Adaptation of this current collection path is thus finished.

Figure 5:
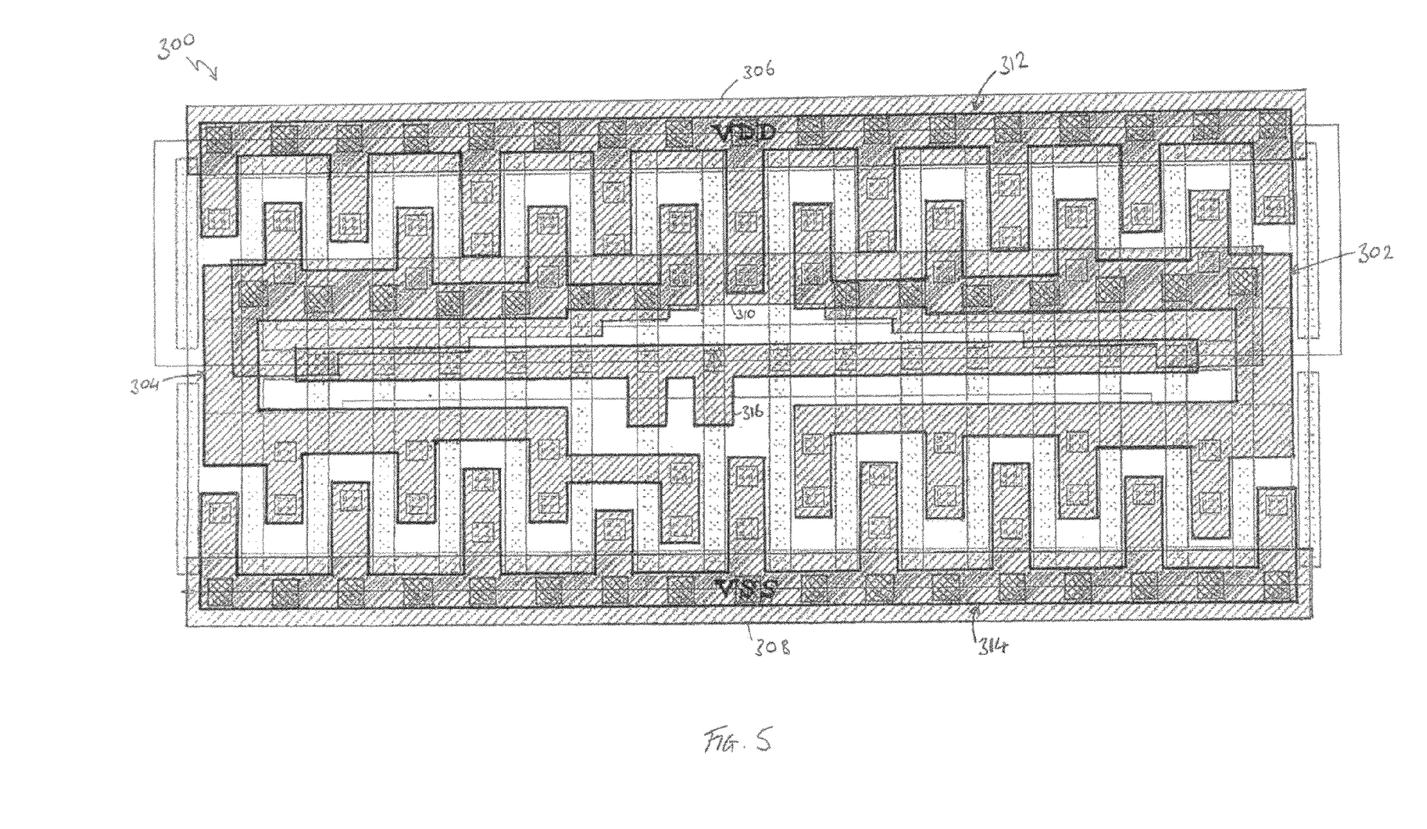
FIG. 5 schematically illustrates a standard cell adapted according to one embodiment.
Figure 6:
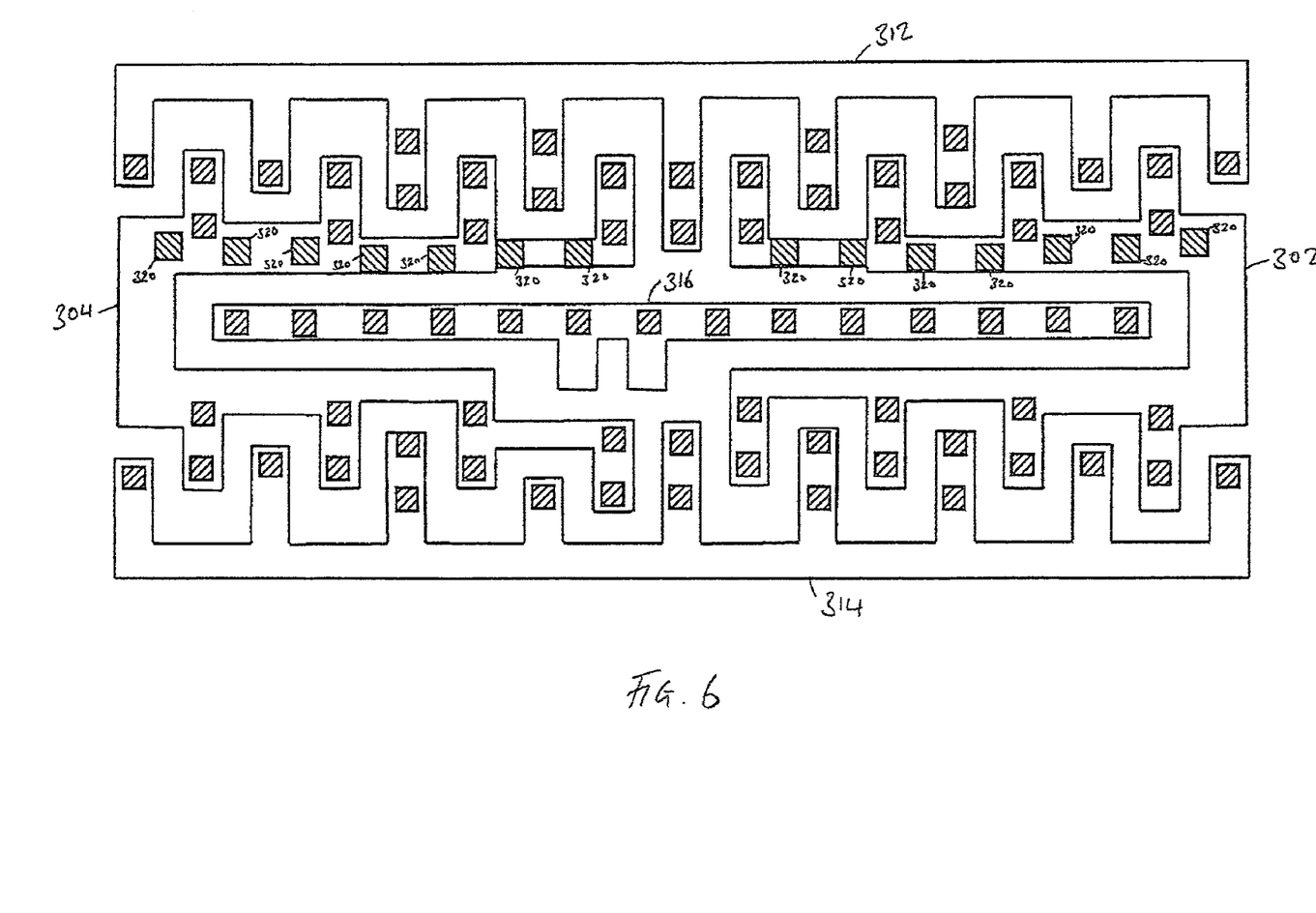
FIG. 6 schematically illustrates the metal 1 layer of the standard cell shown in FIG. 5.
Figure 7:
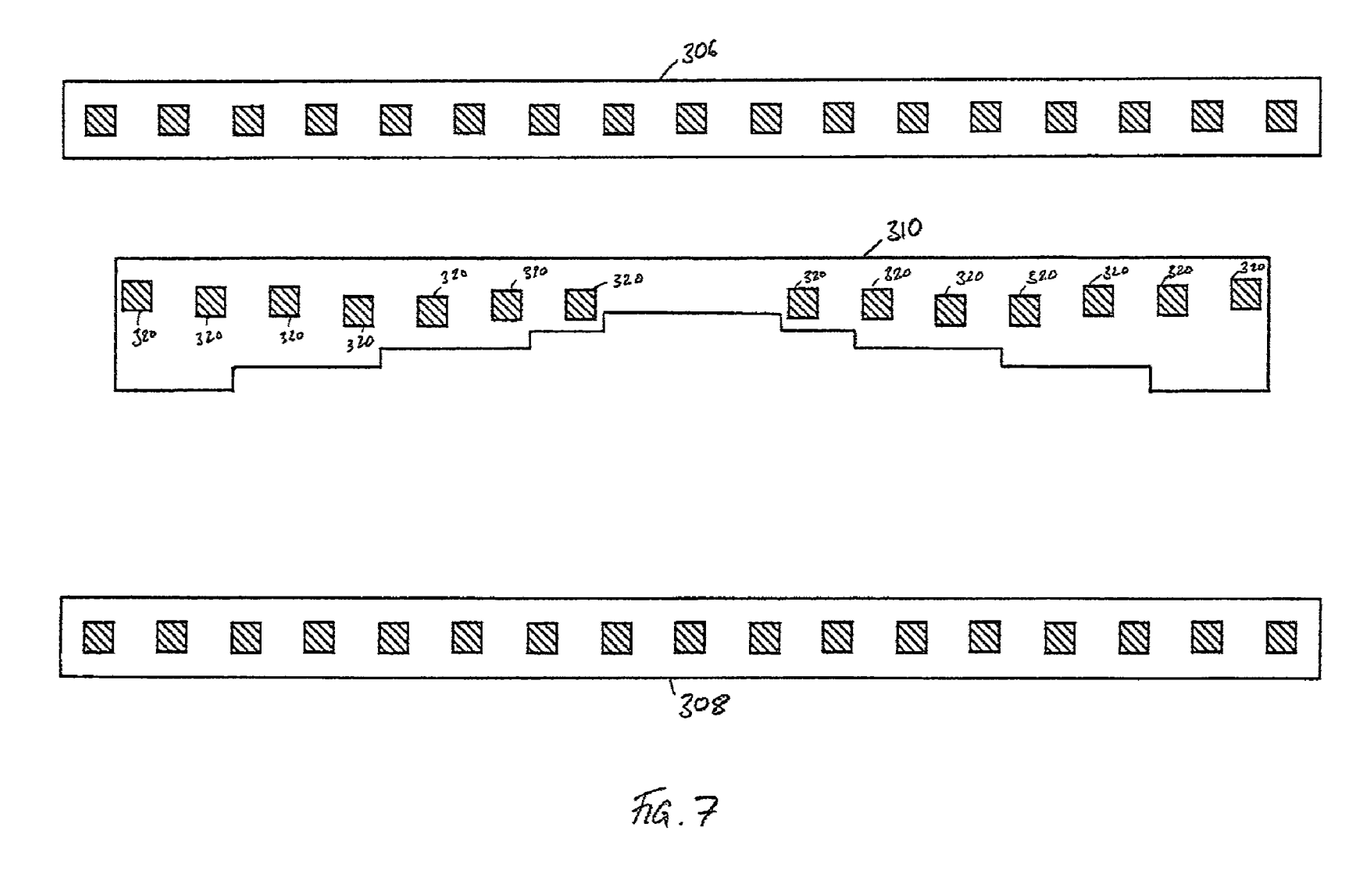
FIG. 7 schematically illustrates the metal 2 layer of the standard cell shown in FIG. 5.

A further example standard cell 300 is now considered with reference to FIGS. 5, 6 and 7. This standard cell 300 also provides an inverter but now a high performance inverter is provided, capable of handling greater currents. This has the consequence that the DC electromigration width limit required for the equivalent output path to the output path 112 illustrated in FIGS. 1 and 3 cannot be achieved by a single M1 wire. Hence, this component is divided in two as shown by the output paths 302 and 304 in FIGS. 5 and 6. This division of a current conduction path can form part of a process such at that described with reference to FIG. 4, wherein when the minimum path width is first determined at step 220, if it is determined that the minimum path width required to carry the expected current would exceed a predetermined width limit (such as a global upper limit on the widths of conduction paths in the standard cell), then the path can first be divided in two (or more, as appropriate) independent paths and a further connection element added in a higher conduction layer to join these independent paths together. The progressive sizing reduction of both the independent paths and the connection element can then be carried out, as discussed below with reference to the example shown in FIGS. 5-7.

Firstly it can be seen that once more a metal 2 layer provides the VDD and VSS power rails 306 and 308 respectively. In addition the M2 layer now also provides a further component 310 which provides the connection between the divided output paths 302 and 304. Within the M1 layer it can be seen that 312 provides the connection to VDD, 314 provides the connection to VSS and 316 provides the input to the inverter. Other components, such as the poly and the active area do not differ from their implementation shown in FIGS. 1-3 and for clarity they are not labelled or discussed here. It should be noted that in this example the M2 wire 310 has been positioned above the PMOS region, but could alternatively have been positioned above the NMOS region instead.

In the case shown in FIGS. 5-7 the maximum DC current corresponds to half of the transistor fingers (8 fingers out of a total of 16 fingers) as only 8 fingers (on either the NMOS or PMOS side) are connected with one another in the M1 layer. The 16 fingers are instead now connected together using the M2 wire 310. Only an RMS current flows through this M2 wire which therefore has to pass the RMS electromigration minimum width constraint.

Hence this M2 wire 310 has also been subjected to an analogous adaptation treatment to that described above, although in this case it is the RMS minimum width limit which is iteratively stepped down. Hence it can be seen (most clearly in FIG. 7) that this M2 wire 310 is narrowed progressively towards the center of the cell from the left or right side (as illustrated). In the centre the RMS constraint has to be passed for a maximum of 8 fingers while it has to be passed for 16 fingers at the far left or right side of this component, since an output connection placed here by the router would result in RMS current flow to all 16 fingers.

Also the M2 wire 310 is connected to the M1 wires 302 and 304 with as many V1 vias 320 as possible in order to split the current handled into as many parts as possible. As part of the iterative sizing process, additional vias may be added where possible. The M1 wires 302 and 304 underneath the M2 wire must be sized to handle the DC current of the 8 fingers in parallel that will be divided in a number of identical parts through the V1 vias. Consider that the total DC current in the 8 fingers is determined to be $I_{DC}8$. As illustrated in the present example (see most clearly in FIG. 7), there are seven vias 320 used to connect M1 to M2 on each side. Each via 320 thus carries a current of $I_{DC}8/7$ and therefore the M1 wire 302/304 width must be progressively sized to sustain $I_{DC}8/7$, $2*I_{DC}8/$ 7, $3*I_{DC}8/7$ and so on (each time a via is passed) when considered moving from the centre of M2 wire 320 to either its left or right end.

The M1 wires 302 and 304 shown in FIGS. 5 and 6 can been seen to have been adapted in the same manner as the M1 wire 112 shown in FIGS. 1 and 3. That is to say the procedure of sizing the path width to satisfy the DC minimum width requirement described with reference to FIG. 4 has been carried out on each of these components, resulting in the stepped width reductions towards the centre of the figures.

The subdivision of the output wire into the two independent M1 output wires 302 and 304, connected by the M2 connection 310, means that a standard cell layout can be achieved which passes the DC and RMS electromigration criteria which would have been impossible using only M1 wires.

Whilst the above described embodiments have been described with reference to standard cells which are each configured to provide an inverter, it will be appreciated that the techniques described are in no way specific to inverters, and may equally be applied to any other type of logic cell.

Although particular example embodiments of the invention have been described herein, it will be apparent that the claims are not limited thereto, and that many modifications and additions may be made within the scope of the claims.

I claim:

1. A method of adapting a layout of a standard cell of an integrated circuit comprising the steps of:
    identifying a current collection path in said standard cell, said current collection path configured to connect components within said standard cell to an output connection, wherein said current collection path is arranged to collect current from said components at a plurality of current collection points arranged along a length of said current collection path;
    determining, one or more computers, a maximum current location on said current collection path at which a maximum possible current flow in said current collection path will occur when said output connection is connected to said maximum current location, said maximum possible current flow being a sum of current contributions from said current collection points;
    determining a maximum width of said current collection path at said maximum current location such that said maximum width satisfies a minimum path width requirement with respect to said maximum possible current flow; and
    selectively sizing a local width of said current collection path at a selected distance from said maximum current location, said local width being less than or equal to said maximum width, such that said local width satisfies said minimum path width requirement with respect to a maximum local current that will occur at said selected distance, said maximum local current being a sum of said current contributions from those current collection points which contribute to said local current.

2. The method as claimed in claim 1, comprising at least one further step of increasing said selected distance and repeating said selectively sizing step.

3. The method as claimed in claim 1, wherein said minimum path width requirement is an electromigration dependent width requirement.

4. The method as claimed in claim 3, wherein said electromigration dependent width requirement is for uni-directional current flow.

5. The method as claimed in claim 3, wherein said electromigration dependent width requirement is for bi-directional current flow.

6. The method as claimed in claim 1, wherein said standard cell is arranged to be provided by selectively depositing materials in layers on a substrate.

7. The method as claimed in claim 1, wherein said components comprise a plurality of transistors.

8. The method as claimed in claim 6, wherein said standard cell comprises a plurality of vias, said plurality of vias connecting two layers of said integrated circuit together.

9. The method as claimed in claim 6, wherein said current collection path is provided as a conduction layer in said layers.

10. The method as claimed in claim 9, wherein said conduction layer is a first conduction layer deposited over said substrate.

11. The method as claimed in claim 9, wherein said conduction layer is a higher conduction layer deposited over said substrate, at least one intervening conduction layer being arranged between said conduction layer and said substrate.

12. The method as claimed in claim 9, wherein said conduction layer is a metal layer.

13. The method as claimed in claim 9, further comprising the steps of:
    identifying a position in said conduction layer in which said local width of said current collection path has been reduced in said selectively sizing step; and
    increasing a size of a further component within said standard cell provided in said conduction layer adjacent to said position.

14. The method as claimed in claim 13, wherein said further component comprises an input connection of said standard cell.

15. The method as claimed in claim 13, wherein said further component comprises a voltage supply connection path.

16. The method as claimed in claim 13, comprising the further step of adding a contact between said further component and another of said layers.

17. The method as claimed in claim 9, wherein if said maximum width of said current collection path is determined to exceed a predetermined width limit, said current collection path is sub-divided into at least two independent current collection paths in said conduction layer and said at least two independent current collection paths are connected together via a higher conduction layer deposited over said substrate.

18. A standard cell adapted according to the method of claim 1.

19. An integrated circuit comprising at least one standard cell adapted according to the method of claim 1.

20. A non-transitory, computer-readable medium comprising a representation of said layout of said standard cell adapted according to the method of claim 1.

* * * * *